United States Patent [19]
Barnett et al.

[11] Patent Number: 5,797,765
[45] Date of Patent: Aug. 25, 1998

[54] COAXIAL CONNECTOR FOR MOUNTING ON A CIRCUIT SUBSTRATE

[75] Inventors: Ron Barnett; Thomas W. Finkle; Michael T. Powers, all of Santa Rosa, Calif.

[73] Assignee: Hewlett-Packard Company, Palo Alto, Calif.

[21] Appl. No.: 743,444

[22] Filed: Nov. 1, 1996

[51] Int. Cl.⁶ ................................................. H01R 9/09
[52] U.S. Cl. ............................................ 439/63; 439/581
[58] Field of Search ........................ 439/63, 83, 581, 439/876

[56] References Cited

U.S. PATENT DOCUMENTS

| | | | |
|---|---|---|---|
| 4,453,796 | 6/1984 | Monroe | 439/581 |
| 4,603,926 | 8/1986 | Nesbit et al. | 439/63 |
| 4,645,288 | 2/1987 | Stursa | 439/581 |
| 4,964,805 | 10/1990 | Gabany | 439/63 |
| 5,120,258 | 6/1992 | Carlton | 439/63 |
| 5,145,382 | 9/1992 | Dickirson | 439/63 |

*Primary Examiner*—Neil Abrams
*Assistant Examiner*—T. C. Patel
*Attorney, Agent, or Firm*—John L. Imperato

[57] ABSTRACT

A coaxial connector mounts directly to a planar substrate of a circuit module and is oriented perpendicularly to the substrate. A radially symmetric coaxial structure, maintained through a conductive bore in the substrate provides a good impedance match to a planar transmission line on the substrate. A flange of the coaxial connector provides the mating surface to the substrate. A nipple formed on the flange fits in the conductive bore, aligning the center conductor in the conductive bore and maintaining the coaxial structure. A bond connects the center conductor to a microstrip transmission line on the top of the substrate. In a first preferred embodiment of the present invention, a threaded flange receives a threaded coaxial bead to form the coaxial connector. In a second preferred embodiment a coaxial cable is soldered into a smooth flange to form a coaxial connector. In a third preferred embodiment a coaxial bead and a flange are integrated to form the coaxial connector. The outer conductor of the bead is continuous with the flange while the center conductor of the bead protrudes through a hole in the flange.

11 Claims, 5 Drawing Sheets

5,797,765

1

COAXIAL CONNECTOR FOR MOUNTING ON A CIRCUIT SUBSTRATE

FIELD OF THE INVENTION

The present invention relates to coaxial connectors and, more particularly, to coaxial connectors that interface to planar substrates in high frequency systems.

BACKGROUND OF THE INVENTION

Coaxial cables route high frequency signals between circuit modules in instruments, test set-ups and other types of systems. While coaxial cables provide a radially symmetric transmission structure for the signals, the transmission structures within the circuit modules are inherently planar. Circuit modules typically incorporate microstrip transmission lines on a planar substrate. Providing an interface or transition between the radially symmetric and the planar transmission structures is a difficult task, especially when the signals are in the microwave or millimeter wave frequency range. Discontinuities at the interface cause impedance mismatches that degrade the performance of systems.

One type of interface between coaxial and planar transmission structures minimizes discontinuities and impedance mismatches by orienting a center conductor of a coaxial bead parallel to the plane of a circuit module's planar substrate. This type of interface anchors the planar substrate to the floor of a package body and then accepts the threaded coaxial bead through a tapped hole in the wall of the package body. The position of the tapped hole aligns the center conductor with the planar transmission structure. Although a good impedance match between the coaxial and planar structures is achieved, this type of interface relies on a package body which significantly increases the size and manufacturing cost of the circuit module.

SUMMARY OF THE INVENTION

In the present invention a coaxial connector mounts directly to a planar substrate of a circuit module, enabling the circuit module to have small size and low manufacturing cost. The coaxial connector is perpendicular to the substrate and is directly attached to the planar substrate. A radially symmetric coaxial structure is maintained through a cylindrical conductive bore in the substrate to match impedances of the coaxial and planar transmission structures. A flange provides a mating surface on the coaxial connector that attaches to the substrate. In accordance with a first preferred embodiment of the present invention, a threaded flange receives a threaded coaxial bead to form the coaxial connector. The flange is soldered to a contact pad on the bottom side of the planar substrate and a hole in the threaded flange aligns with the bore in the substrate. A nipple, concentric with the hole and formed on the flange, centers the hole in the conductive bore. When the threaded coaxial bead is screwed into the flange, the bead's center conductor protrudes through the conductive bore in the substrate, maintaining a coaxial structure through the substrate. On the top side of the substrate the center conductor connects to a microstrip transmission line with a bond.

In accordance with a second preferred embodiment of the present invention a coaxial cable is soldered into a smooth flange to form a coaxial connector. While the outer conductor of the coaxial cable is soldered to the flange, the center conductor of the cable protrudes through a hole in the flange. A nipple, concentric with the hole and formed on the flange

2 centers the hole in the conductive bore in the substrate. This aligns the center conductor in the conductive bore and maintains the coaxial structure through the cylindrical conductive bore. The center conductor protrudes through the bore and connects to a microstrip transmission line on the top side of the substrate with a bond.

In accordance with a third preferred embodiment of the present invention, a coaxial bead and a flange are integrated to form a coaxial connector. The outer conductor of the bead is continuous with the flange while a center conductor of the bead protrudes through a hole in the flange. A nipple formed on the mating surface of the flange fits in a conductive bore in the substrate, aligning the center conductor in the conductive bore and maintaining the coaxial structure through the conductive bore. A bond connects the center conductor to a microstrip transmission line on the top of the substrate.

DETAILED DESCRIPTION OF THE PREFERRED EMBODIMENT

Figure 1A:
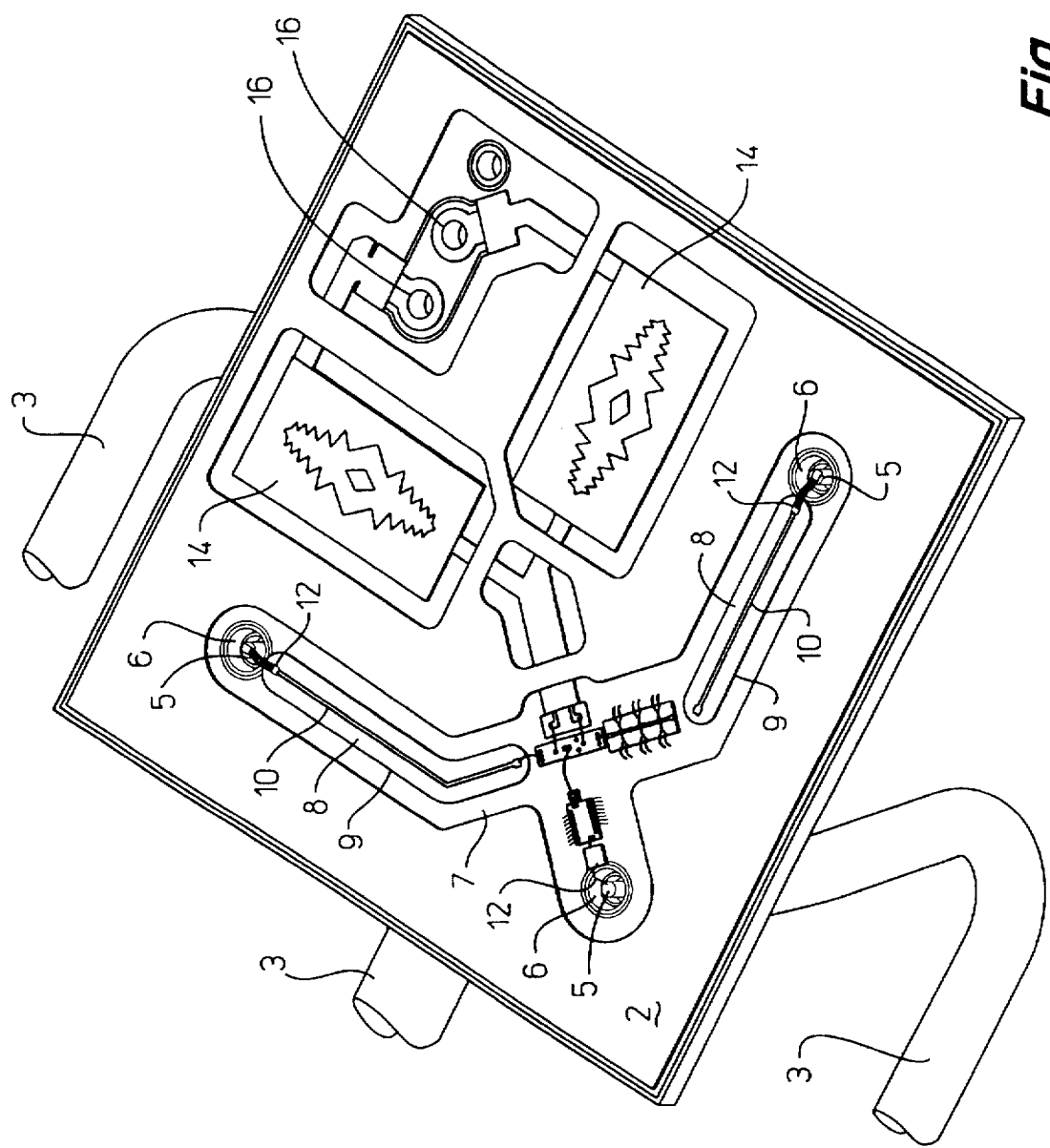
FIG. 1A shows a top view of a circuit substrate that uses the coaxial connectors of the present invention.

FIG. 1A shows a top view of a planar circuit substrate 2 that uses the coaxial connectors of the present invention. The coaxial connectors located on the bottom side of the substrate (not visible in FIG. 1A) provide an interface between coaxial cables 3 and the substrate 2, that does not rely on a package body to secure the positions of the coaxial connectors and the substrate 2. A center conductor 5 of each coaxial connector protrudes through cylindrical conductive bores 6 in the substrate 2. Each conductive bore 6 has metallization that is continuous with a top ground plane 7 that extends thru the conductive bore 6 to a contact pad on a bottom side of the substrate 2. On the top ground plane 7, a planar transmission structure such as a microstrip transmission line 9 formed by depositing dielectric tape 8 on the top ground plane 7 and then printing a conductive trace 10 on the dielectric tape 8. A bond 12, such as a wire bond or ribbon bond, connects the center conductor 5 to the conductive trace 10. DC filter structures 14 isolate high frequency signals from DC and low frequency interfaces 16.

Figure 1B:
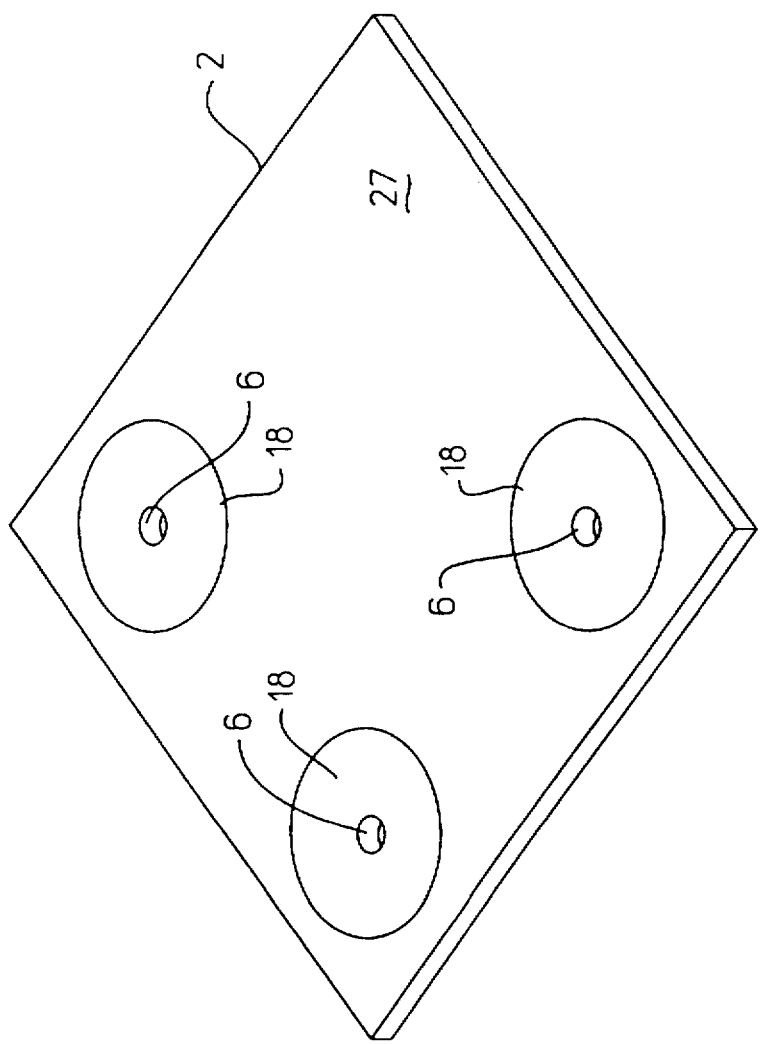
FIG. 1B shows a bottom view of the circuit substrate of FIG. 1A.

FIG. 1B shows a bottom view of the circuit substrate 2 that uses the coaxial connectors (not shown) of the present invention. The contact pads 18 on the bottom 27 of substrate 2 receive a flange of the coaxial connectors. The contact pads 18 are continuous with the top ground plane 7 through the conductive bore 6 in the substrate 2. The contact pads 18 are gold or a combination of platinum, palladium and silver to provide good solder adhesion for the coaxial connectors.

Figure 2:
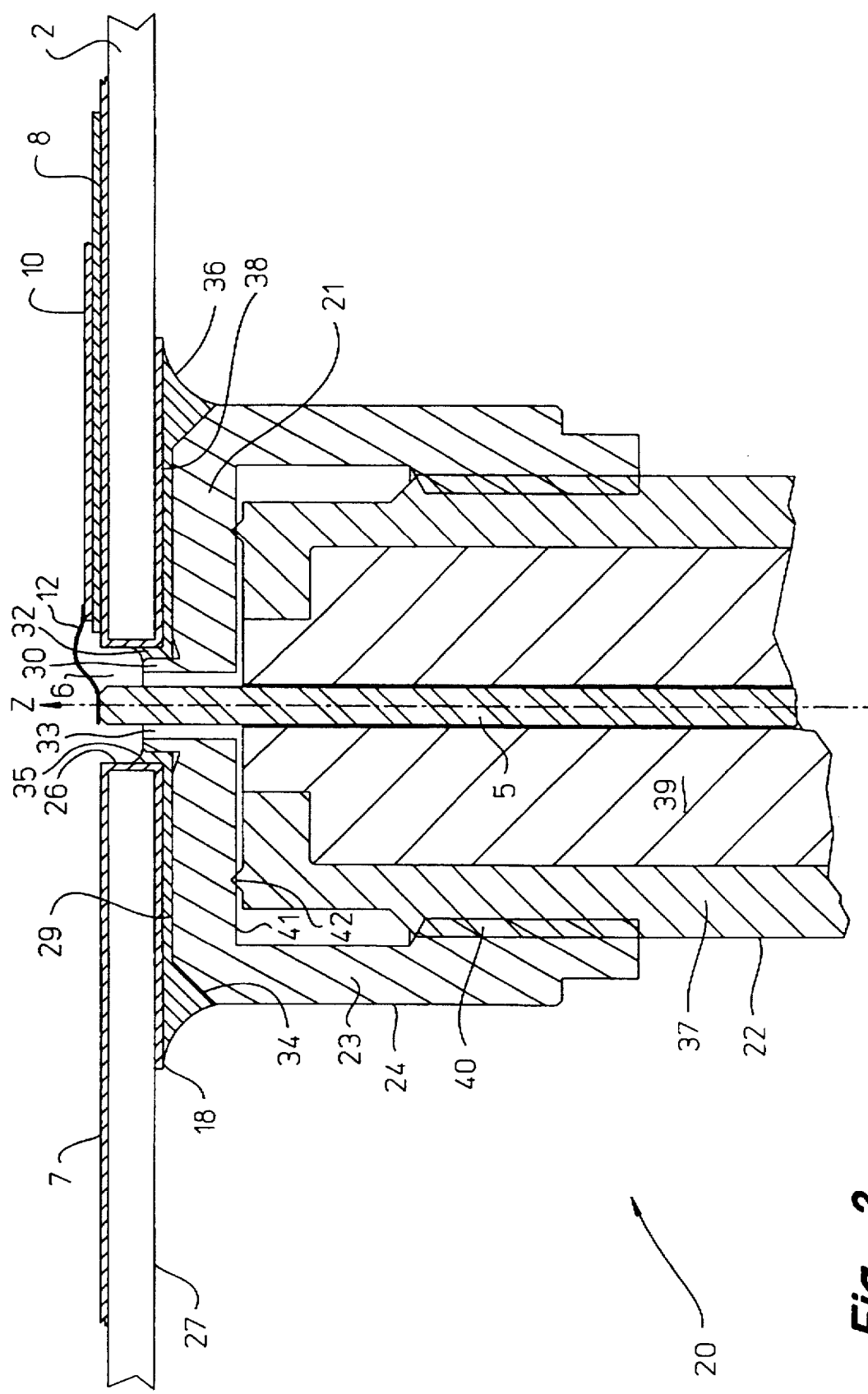
FIG. 2 is a cross-sectional view of a first coaxial connector constructed according to a first preferred embodiment of the present invention.

FIG. 2 is a detailed cross-sectional view of a first coaxial connector 20 constructed according to a first preferred embodiment of the present invention. The coaxial connector is radially symmetric about a major axis Z of a center conductor 5. The coaxial connector 20 has a threaded bead 22 and a threaded flange 24. The threaded flange 24 mates with the substrate 2 and is attached to a contact pad 18 on the substrate 2. A cylindrical conductive bore 6 is formed in the substrate 2 by drilling a cylindrical bore in the substrate 2 and then continuing the conductive top ground plane 7 through the bore, forming conductive sidewalls 26 on the bore. The conductive sidewalls 26 then connect to the circular contact pad 18 on the bottom 27 of the substrate 2. The threaded flange 24 has two continuous portions; a disk portion 21 and a threaded cylindrical sleeve portion 23. The disk 21 has an external surface 29 that is solder attached to the contact pad 18. A nipple 30 protruding from external surface 29 aligns the flange 24 with the conductive bore 6. The nipple 30 is sized smaller than the conductive bore 6 to form a gap 32 between the conductive sidewalls 26 of the conductive bore 6 and the nipple 30. This gap 32 is subsequently filled with solder. The nipple 30 is disposed concentrically about a hole 33 through the center of the disk 21.

A bevel 34 around the perimeter of the external surface 29 of the disk 21 accommodates a donut shaped solder preform (not shown) initially placed between the bevel 34 and the contact pad 18. Once the preform and nipple 30 are positioned, the substrate 2 and threaded flange 24 are heated to melt the solder preform. The contact pad 18 is approximately the same diameter as the external surface 29 of the disk 21, which causes the solder to flow radially from the bevel 34 to the conductive bore 6 and into the gap 32, which acts as a solder reservoir. Solder fillets 35, 36 are formed when the solder cools. By inspecting the fillets 35, 36, the integrity of the solder layer 38 between the contact pad 18 and disk 21, and the nipple 30 and sidewalls 26 of the conductive bore 6 can be determined. Smooth fillets 35, 36 indicate the likely absence of voids in the solder layer 38, whereas discontinuous or missing portions in the fillets indicate the likely presence of voids in the solder layer 38. The volume of solder in the donut shaped preform and the contact force between the flange 24 and substrate 2 during the soldering operation determine the thickness of the solder layer 38.

Once the threaded flange 24 is attached to the contact pad 18 of substrate 2, the threaded coaxial bead 22 is screwed into the threaded cylindrical sleeve 23. The threaded coaxial bead 22 has a threaded outer conductor 37 which is separated from the center conductor 5 with a dielectric material 39. Threaded coaxial beads 22 are known in the art for their use with metal package bodies. Once the threads 40 of the outer conductor 37 fully engage with the threads on the internal walls of the flange 24, the center conductor 5 penetrates the hole 33 in the nipple 30. The knurl 42 on the outer conductor 37 contacts an internal surface 41 of the disk 21. The clearances between the hole 33 and center conductor 5 and the clearance between the conductive sidewalls 26 of the cylindrical conductive bore 6 and center conductor 5 are chosen to compensate for the impedance of the bond 12 connecting the center conductor 5 to the conductive trace 10 on the dielectric tape 8 of the planar transmission line 9 (shown in FIG. 1A).

The threaded flange 24 mates with the coaxial bead 22 such that the center conductor 5, nipple 30 and cylindrical conductive bore 6 form a coaxial structure through the substrate 2. This coaxial structure minimizes discontinuities that cause impedance mismatches between the radially symmetric coaxial connector 20 and the planar structure of the planar transmission line 9.

Figure 3:
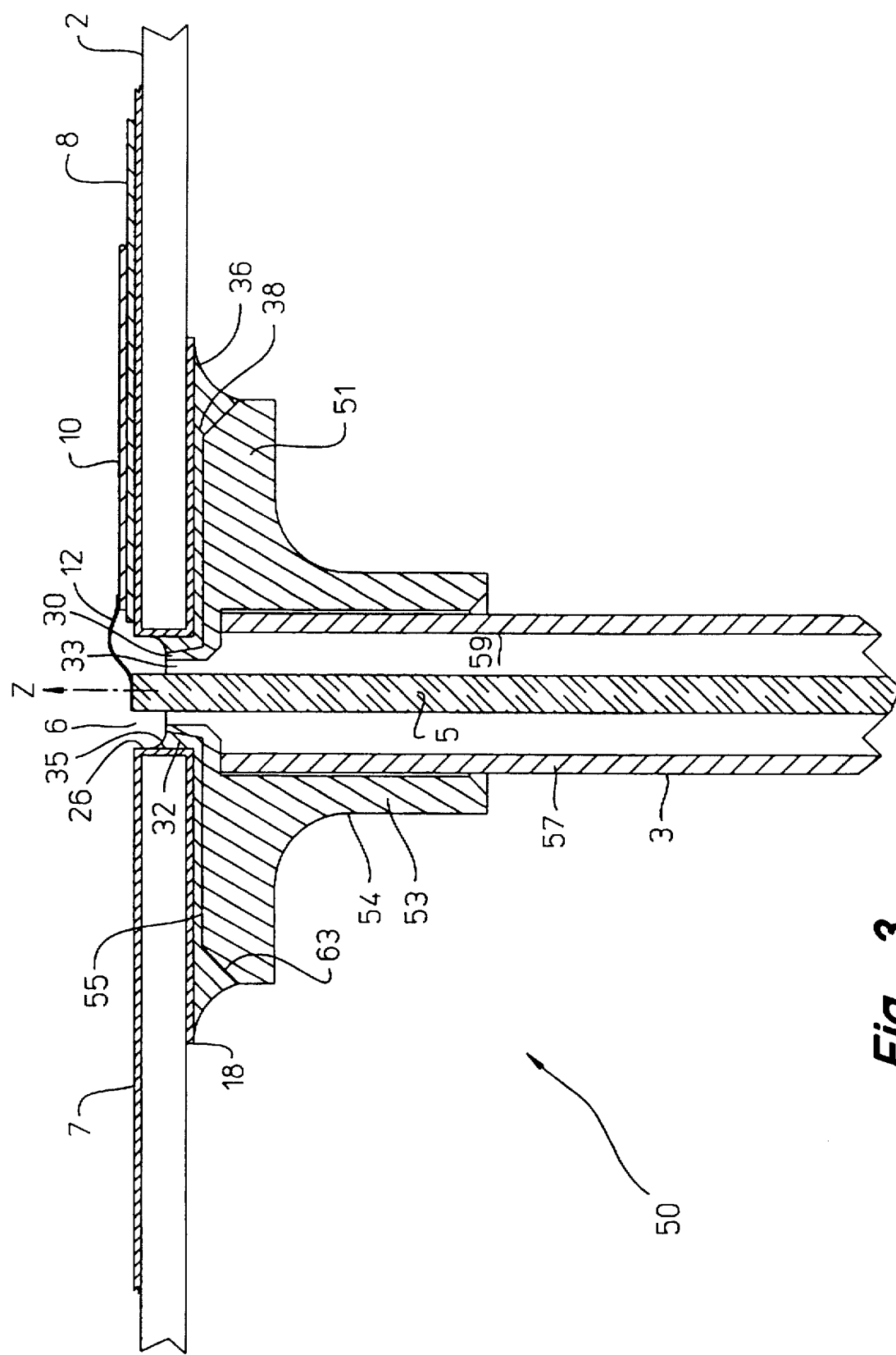
FIG. 3 is a cross-sectional view of a second coaxial connector constructed according to a second preferred embodiment of the present invention.

FIG. 3 is a detailed cross-sectional view of a second coaxial connector 50 constructed according to a second preferred embodiment of the present invention. The coaxial connector 50 is radially symmetric about a major axis Z of a center conductor 5. In this preferred embodiment a coaxial cable 3 is soldered into a smooth flange 54 to form the coaxial connector 50. The flange 54 has two continuous portions, a disk 51 and a smooth cylindrical sleeve 53. Outer conductor 57 of the coaxial cable 3 is soldered to the cylindrical sleeve 53. Both a dielectric 59, which is typically Teflon, and a center conductor 5 penetrate a hole 33 in a nipple 30. The nipple 30 protrudes from an external surface 55 of the disk 51. The nipple 30 aligns the flange 54 into the conductive bore 6 in the substrate 2 and a bevel 63 around the perimeter accommodates a donut shaped solder preform (not shown), initially placed between the bevel 63 and the contact pad 18. Once heated, the solder flows radially from the bevel 63 and into gap 32 which acts as a solder reservoir. Solder fillets 35, 36 provide a visual inspection criteria for the integrity of the solder layer 38 between the contact pad 18 and disk 51, and nipple 30 and conductive sidewalls 26 of the cylindrical conductive bore 6. The clearance between the conductive sidewalls 26 and center conductor 5 is chosen to compensate for the impedance of the bond 12 connecting the center conductor 5 to the conductive trace 10 on the dielectric tape 8 of the planar transmission line 9 (shown in FIG. 1A).

The coaxial connector 50 formed from the flange 54 and the coaxial cable 3 mates with the contact pad 18 on the substrate 2 so that the center conductor 5, nipple 30 and cylindrical conductive bore 6 form a coaxial structure through the substrate 2. This coaxial structure minimizes discontinuities that cause impedance mismatches between the radially symmetric coaxial connector 50 and the planar structure of the planar transmission line 9.

Figure 4:
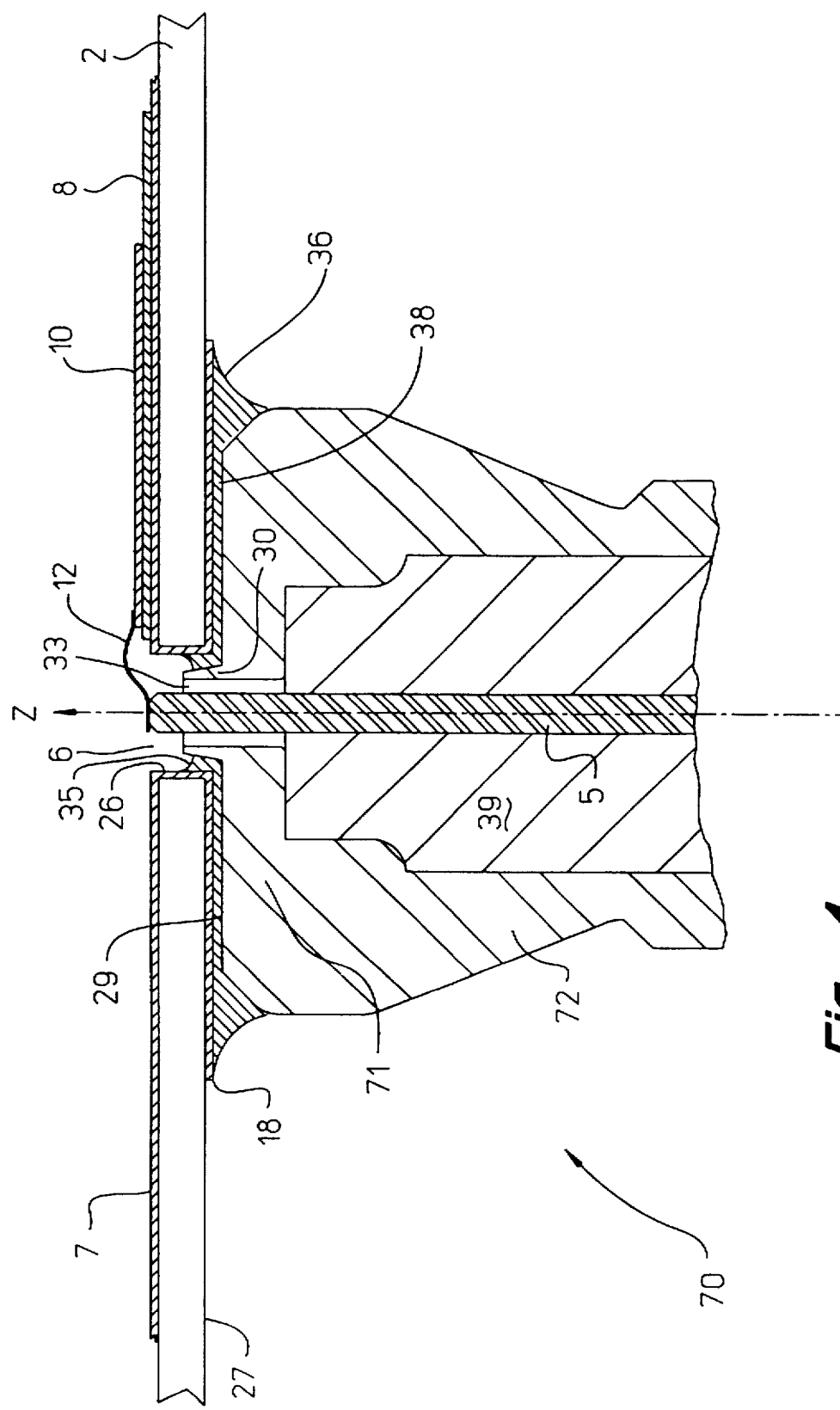
FIG. 4 is a cross-sectional view of a third coaxial connector constructed according to a third preferred embodiment of the present invention.

FIG. 4 is a detailed cross-sectional view of a third coaxial connector 70 constructed according to a third preferred embodiment of the present invention. The coaxial connector 70 is radially symmetric about a major axis Z of a center conductor 5. In this preferred embodiment a coaxial bead and flange are integrated to form the coaxial connector 70. A cylindrical sleeve 72 forms an outer conductor for center conductor 5 in the coaxial connector 70. The center conductor 5 and cylindrical sleeve 72 are separated with dielectric material 39. A disk 71, continuous with the cylindrical sleeve 72 mates with contact pad 18 on the bottom 27 of substrate 2 that is continuous with the top ground plane 7. The center conductor 5 extends from dielectric material 39 and penetrates a hole 33 in nipple 30 formed on an external surface 29 of disk 71. The center conductor 5 also penetrates a cylindrical conductive bore 6 in the substrate 2. Once the external surface 29 is soldered to contact pad 18, solder fillets 35, 36 form. The solder fillets 35, 36 provide a visual inspection criteria for the integrity of the solder layer 38 between the contact pad 18 and the disk 71, and nipple 30 and sidewalls 26 of the cylindrical conductive bore 6. The clearance between the center conductor 5 and hole 33 through nipple 30, and the clearance between center conductor 5 and the conductive sidewalls 26 of conductive bore 6 are chosen to compensate for the impedance of the bond 12 connecting the center conductor 5 to the conductive trace 10 on the dielectric tape 8 of the planar transmission line 9 (shown in FIG. 1A).

The disk 71 of the coaxial cable 3 mates with the contact pad 18 on the substrate 2 so that the center conductor 5, nipple 30 and conductive bore 6 form a coaxial structure through the substrate 2. This coaxial structure minimizes discontinuities that cause impedance mismatches between the radially symmetric coaxial connector 70 and the planar structure of the planar transmission line 9.

In each of the preferred embodiments of the present invention, the diameter of the hole 33 and the diameter of the conductive bore 6 can be adjusted relative to the dimensions of the center conductor 5, to correspondingly vary the impedance of the coaxial structure formed through the substrate 2. This adjustment may be to accommodate the impedance of the bond 12 connecting between center conductor 5 and conductive trace 10, or to otherwise vary the impedance of the coaxial structures formed by the coaxial connectors 20, 50, 70 mounted on the substrate 2.

What is claimed is:

1. A coaxial connector mating to a planar substrate having a contact pad and a conductive bore connecting to the contact pad, the coaxial connector comprising:

a conductive disk having a hole in its center and a beveled edge around a perimeter of a first surface of the disk;

a nipple protruding from the first surface, disposed concentrically about the hole, the hole being continuous through the nipple;

a cylindrical sleeve extending from a second surface of the disk and having a central axis aligned with the hole;

a center conductor along the central axis of the cylindrical sleeve, penetrating the hole through the disk and nipple and penetrating the conductive bore, whereby the center conductor is centered in the conductive bore when the nipple is positioned in the conductive bore.

2. The coaxial connector of claim 1 wherein the first surface of the disk is soldered to the contact pad, the solder forming a first solder fillet between the bevel and the contact pad, forming a solder layer between the first surface and the contact pad, and forming a second solder fillet between the nipple and conductive bore.

3. The coaxial connector of claim 2 further comprising a dielectric separating the center conductor from the cylindrical sleeve.

4. The coaxial connector of claim 3 wherein the cylindrical sleeve includes an internal threaded surface receiving a threaded outer conductor of a threaded coaxial bead, the threaded coaxial bead providing the center conductor and dielectric.

5. The coaxial connector of claim 3 wherein the cylindrical sleeve has a smooth inner surface soldered to an outer conductor of a coaxial cable, the coaxial cable providing the center conductor and the dielectric.

6. The coaxial connector of claim 1 wherein the first surface of the disk is soldered to the contact pad, the solder forming a first solder fillet between the bevel and the contact pad, forming a solder layer between the first surface and the contact pad and forming a second solder fillet between the nipple and conductive bore.

7. The interface of claim 6 further comprising a dielectric separating the center conductor from the cylindrical sleeve.

8. The coaxial connector of claim 7 wherein the cylindrical sleeve includes an internal threaded surface receiving a threaded outer conductor of a threaded coaxial bead, the threaded coaxial bead providing the center conductor and dielectric.

9. The coaxial connector of claim 7 wherein the cylindrical sleeve has a smooth inner surface soldered to an outer conductor of a coaxial cable, the coaxial cable providing the center conductor and the dielectric.

10. An interface between a radial symmetric coaxial structure and a planar structure, comprising:

a planar substrate having a conductive pad on a bottom side, a ground plane on a top side and a cylindrical bore having conductive sidewalls connecting the contact pad to the ground plane;

a conductive disk having a hole in its center and a beveled edge around a perimeter of a first surface of the disk;

a nipple protruding from the first surface disposed concentrically about the hole, the hole being continuous through the nipple;

a cylindrical sleeve extending from a second surface of the disk and having a central axis concentric with the hole;

a center conductor along the central axis of the cylindrical sleeve, penetrating the hole through the disk and nipple and penetrating the conductive bore, whereby the center conductor is centered in the conductive bore when the nipple is positioned in the conductive bore.

11. The interface of claim 10 further comprising a planar transmission line having dielectric tape deposited on the ground plane and having a conductive trace printed on the dielectric tape, whereby the center conductor is connected to the conductive trace with a bond.

* * * * *